(12) United States Patent
Eisner

(10) Patent No.: US 8,008,636 B2
(45) Date of Patent: Aug. 30, 2011

(54) ION IMPLANTATION WITH DIMINISHED SCANNING FIELD EFFECTS

(75) Inventor: Edward C. Eisner, Lexington, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 334 days.

(21) Appl. No.: 12/338,644

(22) Filed: Dec. 18, 2008

(65) Prior Publication Data

US 2010/0155623 A1    Jun. 24, 2010

(51) Int. Cl.
  *H01J 37/317* (2006.01)
  *H01J 376/256* (2006.01)
  *H01J 3/14* (2006.01)

(52) U.S. Cl. ............ 250/492.21; 250/492.1; 250/492.2; 250/492.22; 250/492.23; 250/396 ML; 250/396 R

(58) Field of Classification Search ............. 250/492.21, 250/492.1, 492.2, 492.22, 492.23, 396 R, 250/396 ML
See application file for complete search history.

(56) References Cited

U.S. PATENT DOCUMENTS

| | | | |
|---|---|---|---|
| 5,481,116 A | | 1/1996 | Glavish et al. |
| 6,903,350 B1 * | | 6/2005 | Vanderberg et al. ...... 250/492.21 |
| 7,019,314 B1 * | | 3/2006 | Benveniste et al. ...... 250/492.21 |
| 7,566,886 B2 * | | 7/2009 | Eisner et al. ............. 250/492.21 |
| 7,615,763 B2 * | | 11/2009 | Vanderberg et al. ...... 250/492.21 |
| 7,800,082 B2 * | | 9/2010 | Kellerman et al. ...... 250/492.21 |
| 2010/0308215 A1 * | | 12/2010 | Vanderberg et al. ......... 250/281 |

* cited by examiner

*Primary Examiner* — Nikita Wells
(74) *Attorney, Agent, or Firm* — Eschweiler & Associates, LLC

(57) ABSTRACT

Ion implantation systems and scanning systems are provided, in which a focus adjustment component is provided to adjust a focal property of an ion beam to diminish zero field effects of the scanner upon the ion beam. The focal property may be adjusted in order to improve the consistency of the beam profile scanned across the workpiece, or to improve the consistency of the ion implantation across the workpiece. Methods are disclosed for providing a scanned ion beam to a workpiece, comprising scanning the ion beam to produce a scanned ion beam, adjusting a focal property of an ion beam in relation to zero field effects of the scanner upon the ion beam, and directing the ion beam toward the workpiece.

20 Claims, 7 Drawing Sheets

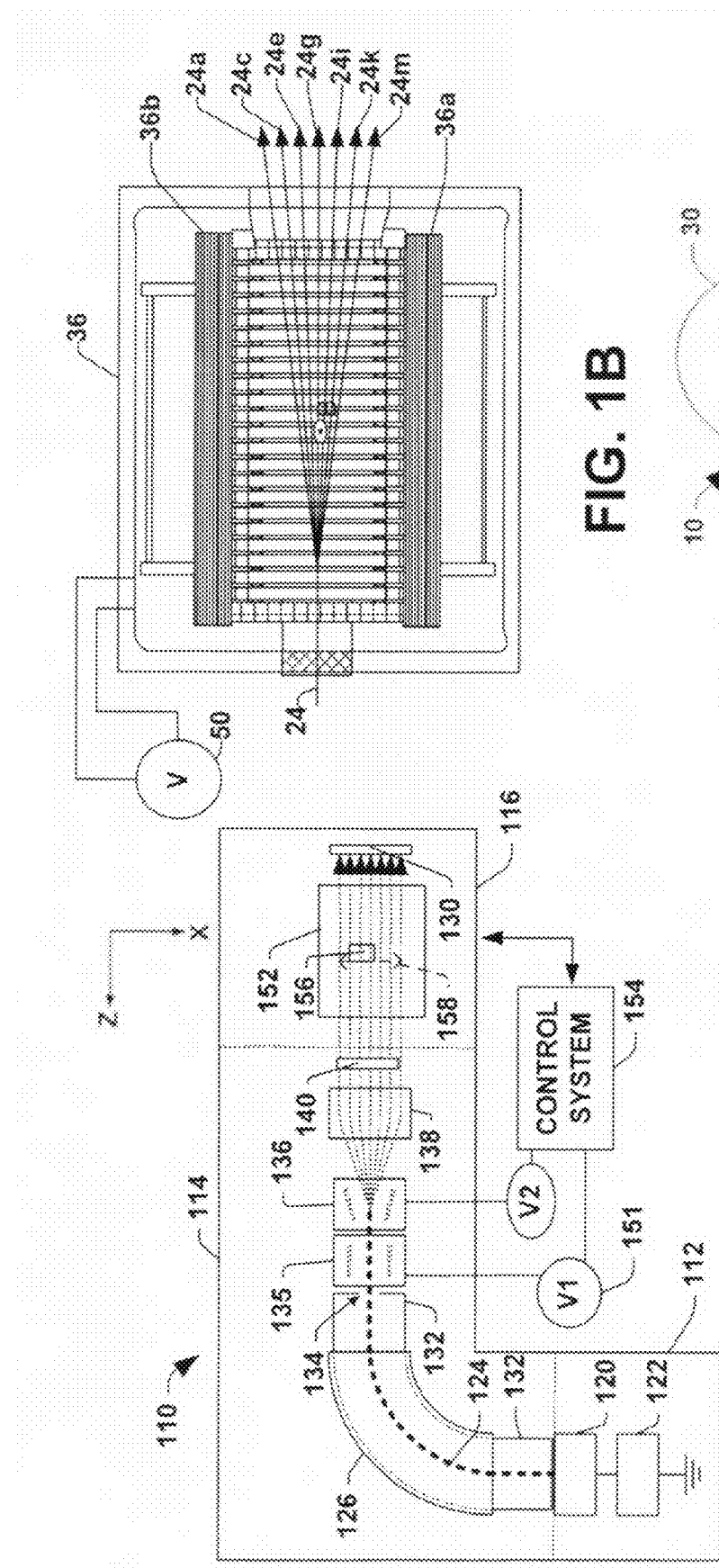
FIG. 1A
FIG. 1B
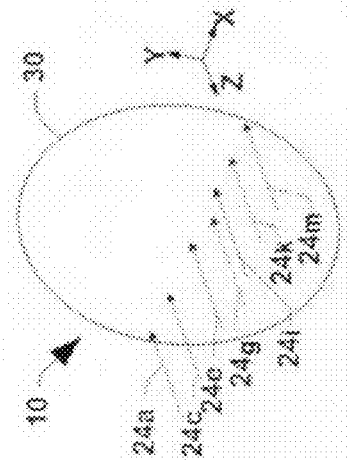
FIG. 1D
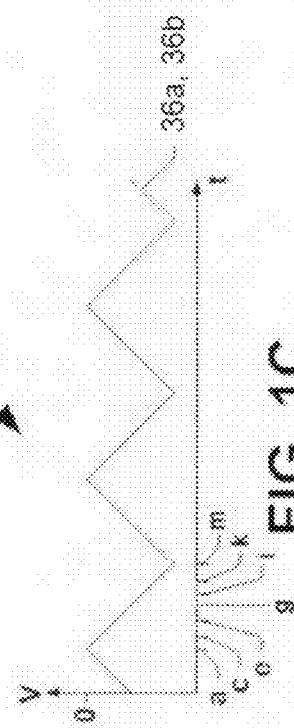
FIG. 1C

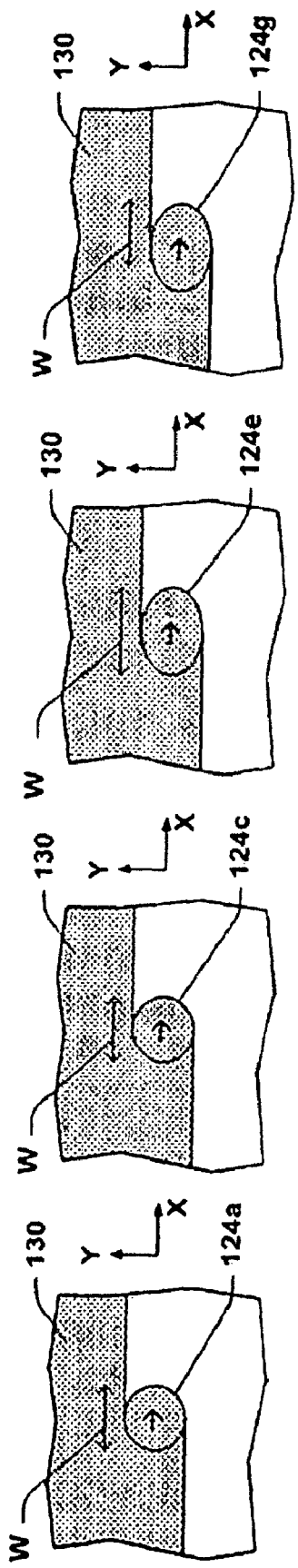
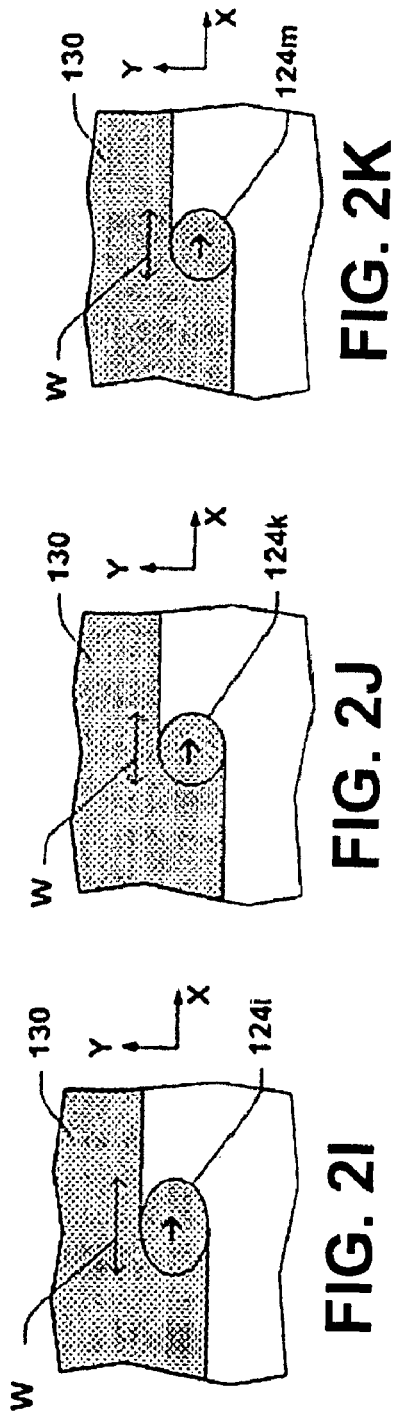
FIG. 2E  FIG. 2F  FIG. 2G  FIG. 2H
FIG. 2I  FIG. 2J  FIG. 2K

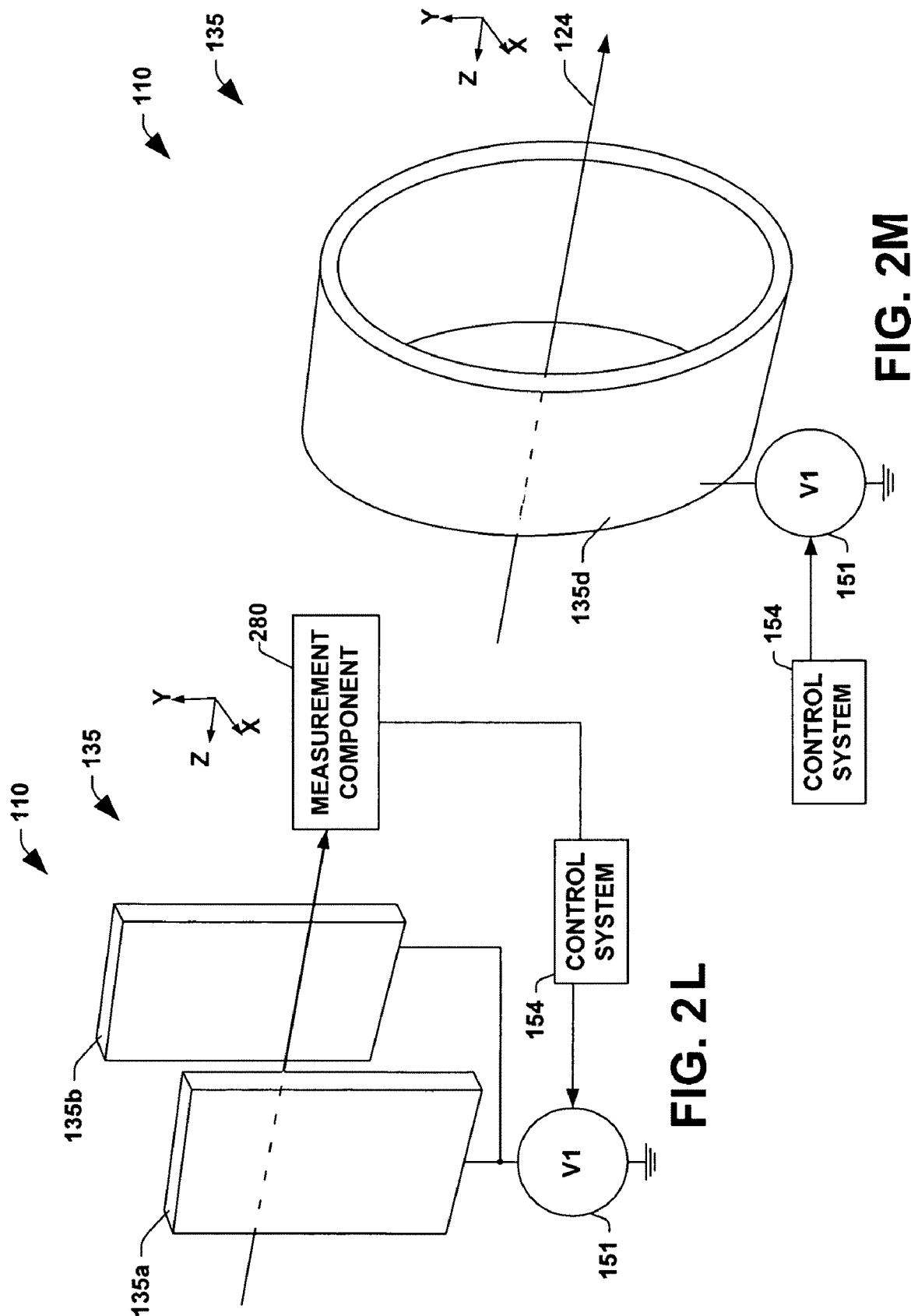

ION IMPLANTATION WITH DIMINISHED SCANNING FIELD EFFECTS

FIELD

The present disclosure relates generally to ion implantation systems, and more specifically to systems and methods that facilitate consistency in an ion beam scanned across a workpiece by mitigating zero field effects of ion beam scanning.

BACKGROUND

In the manufacture of semiconductor devices and other products, ion implantation is used to dope semiconductor wafers, display panels, and other workpieces with impurities that create certain electronic properties for electronic components. Ion implanters or ion implantation systems treat a workpiece with an ion beam to produce n or p-type doped regions, or to modify the strain in certain regions, or to form passivation layers in the workpiece. When used for doping semiconductors, the ion implantation system injects a selected ion species to produce the desired extrinsic material, wherein implanting ions generated from source materials such as antimony, arsenic, or phosphorus results in n-type extrinsic portions in a semiconductor wafer, and implanting ions generated from source materials such as boron, gallium, or indium creates p-type extrinsic material portions in a semiconductor wafer. The ion beam is generally scanned across the surface of the semiconductor wafer to implant the ions from the source material, and the scanning is typically performed by a scanning component.

In a single wafer ion implantation system with scanned beam, uniformity correction is typically achieved by varying the scan speed. This requires a high bandwidth scanner. In magnetically-scanned systems, this requirement can be difficult to meet due to eddy-current losses, among other factors. In both magnetic and electrostatic systems, the beam neutralization in the scanner region can change markedly as the scan field passes through zero. This beam neutralization change can cause the beam size to change and the beam current to change. These changes are called the zero field effects (ZFE). The ZFE are typically small and not much of a problem in medium-current and high energy systems because the beam is typically at fairly high energies through the scanner. In magnetically-scanned high current beamlines, the ZFE can be dramatic with the beam current changing drastically and shrinking in size by a comparable amount. Consequently, this puts a heavy demand on the dynamic range of the scanner and requires sophisticated correction algorithms. There is therefore a need for a simple way to avoid the downsides of ZFE while taking advantage of the simplicity of bipolar scanning.

SUMMARY

The following presents a simplified summary in order to provide a basic understanding of the disclosure herein. This summary is not an extensive overview. It is intended neither to identify key or critical elements, nor to delineate the scope of the disclosure herein. Rather, its primary purpose is merely to present one or more concepts in a simplified form as a prelude to the more detailed description that is presented later.

As noted hereinabove, the present disclosure relates to ion implantation systems, and particularly to improvements in the focusing of an ion beam to facilitate implantation uniformity across a workpiece. The implantation system includes a scanner unit, which bends or steers the ion beam by generating a field, e.g., a magnetic field, an electric field, or a combination of both. The field of the scanner interacts with the ion beam to induce a time-varying angular deflection that scans the ion beam across the workpiece. It also acts as a time-varying lens that dynamically changes the focal properties of the beam as the beam is scanned. However, the field of the scanner may also affect the properties of the ion beam in an unintended, and perhaps undesirable, manner by interacting via changes in the space-charge neutralization of the beam, rather than a direct force on the beam ions. In general, these effects happen as the magnitude of the scanner field (electric, magnetic, or both) goes to zero and are called "zero-field effects."

The present disclosure discusses an ion implantation system having a configuration that may avoid the adverse consequences of these zero-field effects. Ion implantation systems, scanning systems, and methods for providing scanned ion beams to a workpiece, in which one or more focusing properties of an ion beam are adjusted or corrected to compensate for the zero-field effects of a scanning mechanism, are disclosed. The disclosure finds utility in any type of ion implantation application, and may be advantageously employed to mitigate incident beam variations along a scan direction, thereby improving implantation consistency/uniformity in implanted workpieces.

To the accomplishment of the foregoing and related ends, the following description and annexed drawings set forth in detail certain illustrative aspects and implementations of the disclosure herein. These are indicative of but a few of the various ways in which one or more aspects of the disclosure herein may be employed. Other aspects, advantages and novel features may become apparent from the following detailed description when considered in conjunction with the annexed drawings.

BRIEF DESCRIPTION OF THE DRAWINGS

FIG. 1A is a schematic diagram illustrating an exemplary ion implantation system having a scanning system with a scanner and focus adjustment component in accordance with the present disclosure;

FIG. 1B is a partial top plan view illustrating the scanner of the implantation system of FIG. 1B and several exemplary scanned ion beams;

FIG. 1C is a graph illustrating scanning coil current waveforms in the scanner of FIGS. 1A and 1B;

FIG. 1D is a perspective view illustrating a scanned ion beam striking a workpiece in the system of FIGS. 1A and 1B at several discrete points in time;

FIGS. 2E-2K are partial front elevation views illustrating more consistent ion beam width upon striking the workpiece in the ion implantation system at several discrete points in time through operation of the exemplary focus adjustment component;

FIG. 2L is a simplified perspective view illustrating two exemplary focus adjustment electrodes located on opposite sides of the ion beam path in the exemplary focus adjustment component of FIGS. 1A and 1B;

FIG. 2M is a perspective view illustrating a focus adjustment component in accordance with the present disclosure, comprising an Einzel lens surrounding the ion beam path;

DETAILED DESCRIPTION

Figures 1E, 1F, 1G, 1H, 1I, 1J, 1K, 1L:
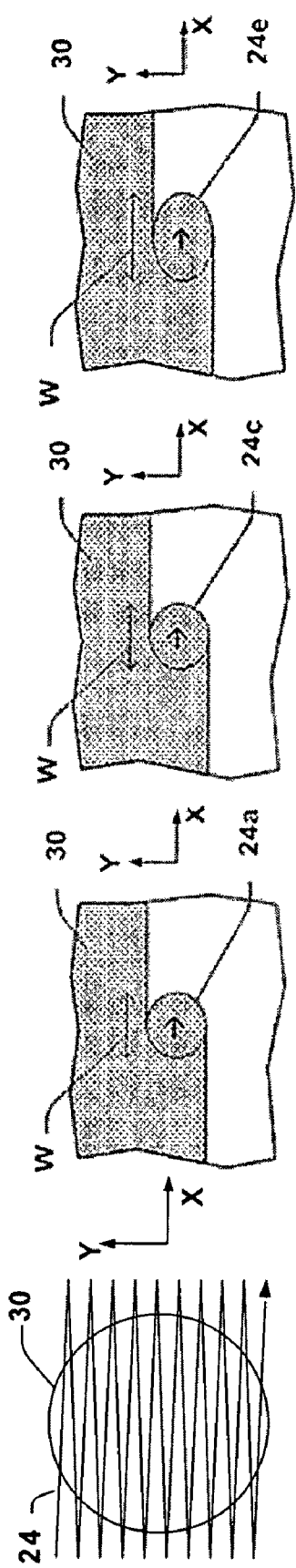
FIG. 1E is a side elevation view illustrating scanning of an ion beam across a workpiece.
FIGS. 1F-1L are partial front elevation views illustrating variation in the ion beam width upon striking the workpiece due to focal properties of the scanner and space-charge neutralization changes due to the scanner in the ion implantation system of FIGS. 1A and 1B.

One or more aspects of the disclosure herein are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the disclosure herein. It may be evident, however, to one skilled in the art that one or more aspects of the disclosure herein may be practiced with a lesser degree of these specific details. In other instances, well-known structures and devices are illustrated in block diagram form in order to facilitate describing one or more aspects of the disclosure herein.

As discussed hereinabove, the present disclosure relates to ion implantation systems for implanting an impurity into workpieces such as semiconductor wafers. These systems generally function by generating an ion beam containing ions of the impurity species, directing the ion beam through various filtering and processing mechanisms that define and refine the properties of the ion beam, and directing the ion beam at an end station, on which the workpiece is positioned. The ion beam is scanned across the surface of the workpiece to expose the desired portions of the workpiece to the ion beam, and therefore to implant the impurity in the desired portions of the workpiece.

FIG. 1A illustrates an exemplary low energy ion implantation system or ion implanter 110 with a scanner 136 and focus adjustment or adjustment apparatus 135. As illustrated in FIG. 1A, the ion implantation system 110 comprises a terminal 112, a beamline assembly 114, and an end station 116. An ion source 120 in the terminal 112 is powered by a power supply 122 to produce an extracted ion beam 124, wherein the source 120 comprises one or more extraction electrodes (not shown) to extract ions from the source chamber and thereby to produce the extracted ion beam 124. While the ion implantation system 114 of FIG. 1A depicts many components having particular positions and disposed in a specific order along the beamline, it will be appreciated that those of ordinary skill in the art may devise many systems including such components in various positions and orderings that may be in accordance with the present disclosure.

The beamline assembly 114 comprises a beamguide 132 having an entrance near the source 120 and an exit with an exit aperture 134. The beamline assembly further comprises a mass analyzer 126 that receives the extracted ion beam 124 and generates a dipole magnetic field that selectively filters the ions of the ion beam based on charge-to-mass ratio, such that the resulting ion beam contains only ions having a desired charge-to-mass ratio (or falling with a range of desired ratios.) The resulting mass analyzed ion beam 124 is passed through the resolving aperture 134 to a workpiece 130 in the end station 116. Various beam forming and shaping structures (not shown) may be produced to maintain the ion beam 124 and which bound an elongated interior cavity or passageway through which the beam 124 is transported along a beam path to one or more workpieces 130 supported in the end station 116.

The beamline assembly 114 further comprises a scanning system with a scanner 136 and a focus adjustment apparatus 135, as well as a parallelizer 138. The scanner 136 receives the ion beam 124, and in some embodiments, the ion beam provided to the scanner has been focused into a relatively narrow profile (e.g., a "pencil" beam in the illustrated system 110). As noted hereinabove, the scanner 136 modifies the ion beam 124 by generating an electric or magnetic field (or both) proximate to the ion beam. The scanner 136 scans the beam 124 back and forth in the X direction to spread the beam 124 out into an elongated "ribbon" profile (e.g., a scanned beam 124), having an effective X direction width that is at least as wide as the workpiece 130. The ribbon beam 124 is then passed through the parallelizer 138 that directs the ribbon beam toward the workpiece 130 substantially parallel to the Z direction (e.g., substantially perpendicular to the workpiece surface), although angled implants are also contemplated. As explained in the description of FIG. 1, the field generated by the scanner 136 and used to scan the ion beam 124 can produce certain undesirable effects, such as the zero-field effect, which may lead to inconsistencies in the dosing (implanted ion density) across the workpiece 130 or inconsistencies in the beam size and instantaneous beam current density across the workpiece 130. The focus adjustment component 135 of the scanning system may be configured to adjust a focal property of the ion beam 124 in relation to the zero-field effects of the scanner 136 upon the ion beam 124, and to produce a focus adjusted ion beam 124. The focal property can be any focal properties inherent to the ion beam, for example, beam size, beam current, and/or ion dosage. The focus adjustment component 135 can consequently provide consistency of the focal property being measured as the beam is scanned across the workpiece 130.

The implanter 110 may employ different types of end stations 116. For example, "batch" type end stations can simultaneously support multiple workpieces 130, wherein the workpieces 130 are moved through the path of the ion beam until all the workpieces 130 are completely implanted. A "serial" type end station, on the other hand, supports a single workpiece 130 along the beam path for implantation, wherein multiple workpieces 130 are implanted one at a time in serial fashion, with each workpiece 130 being completely implanted before implantation of the next workpiece 130 begins. The illustrated end station 116 is a "serial" type end station that supports a single workpiece 130 along the beam path for implantation (e.g., a semiconductor wafer, display panel, or other workpiece to be implanted with ions from the beam 124).

In either case, a beam profiling component 152 is situated near the workpiece location and configured to measure a profile property of the ion beam profile. The ion beam 124 passes through the beam profiling component 152, which comprises one or more profilers 156 that may continuously traverse a profiler path 158, thereby measuring one or more properties of the profile of the scanned ion beam. In the illustrated beam profiling component 152, the profiler 156 includes a current density sensor, such as a Faraday cup, for measuring the current density of the scanned beam. The current density sensor moves in a substantially orthogonal fashion relative to the scanned beam and thus typically traverses the width of the ribbon beam. The beam profiling component 152 is operably coupled to the control system 154 to receive command signals therefrom and to provide measurement values thereto. It will be appreciated that the beam profiling component 152 may be implemented as described in U.S. patent application Ser. No. 11/784,709, filed on Apr. 19, 2007, entitled ION BEAM SCANNING CONTROL METHODS AND SYSTEMS FOR ION IMPLANTATION UNIFORMITY, the entirety of which is hereby incorporated by reference as if fully rewritten herein. The control system 154 adjusts the scan waveform of the scanner 136 to provide a more consistent flux profile at the workpiece 130. If the beam properties vary substantially across the workpiece, it may not be possible for the control system 154 to produce a scan waveform that can make the profile more consistent. This can occur, for example, where the scanner 136 does not have the dynamic range to comply with the control signal.

The focus adjustment component 135 adjusts one or more focal properties of the ion beam 124 in relation to the zero-field effects of the scanner 136 upon the ion beam 124. In many implementations, it is desirable to keep the beam size constant at the workpiece for all points across the workpiece, and the focus adjustment component 135 may be used for this purpose (see, e.g., U.S. Pat. No. 6,903,350.) Alternatively, the beam size may be modified to improve the consistency of the flux density across the workpiece. Accordingly, the control system 154 may produce a control signal with which the scanner can comply (i.e., within the dynamic range of the scanner.) In the example of FIGS. 2A-2L, the focus adjustment component 135 generates time varying magnetic fields proximate to the mass analyzed ion beam 124 that operate to adjust the focal property of the ion beam 124.

In order to induce the desired focal adjustments to the ion beam 124, the focus adjustment component 135 may adjust the focal property of the ion beam 124 by generating another field, e.g. an electric field, in proximity to the ion beam 124. The strength of the field generated by the focus adjustment component 135 may be adjusted in relation to the zero-field effects of the scanner 136 upon the ion beam 124, and many techniques may be useful for this relationship. In one set of embodiments, the focal adjustment induced by the focus adjustment component 135 is related to the strength of the field of the scanner 136. For example, when the scan field is below a predetermined threshold and approaches about zero, the adjustment field can comprise an inverse relation to the scan field, and thus, be increased by the adjustment component as a consequence. In another set of embodiments, the focal adjustment induced by the focus adjustment component 135 is related to the angular deflection of the ion beam 124 induced by the scanner 136, and/or the angle of incidence of the ion beam 124 with the workpiece 130. In still another set of embodiments, the focal adjustment induced by the focus adjustment component 135 is related to the profile of the ion beam 124 to which the workpiece 130 is exposed. In these embodiments, the profile of the ion beam 124 may be measured by positioning an ion beam profiling component in the path of the ion beam 124 that is configured to measure the profile of the ion beam 124.

Referring to FIGS. 1B-1E, a magnetic scanner 36 is illustrated in FIG. 1B that can have a pair of pole pieces and a pair of coils 36a, 36b above and below the beam path, and a current source 50 that provides alternating currents to the coils 36a, 36b, as illustrated in a waveform diagram 60 in FIG. 1C. The time varying current applied to the coils 36a & 36b generates a time varying magnetic field across the beam path between the poles, by which the beam 24 is bent or deflected (e.g., scanned) along a scan direction (e.g., the X direction in FIGS. 1A, 1B, and 1D-1L). When the scanner magnetic field is in the direction from the top pole to the bottom pole (such as at times "a" through "e" in FIG. 1C), the positively charged ions of the beam 24 are subjected to a negative lateral force on the X axis. When the magnetic field is zero (such as at time "g" in FIG. 1C), the beam 24 passes through the scanner 35 unmodified. When the field is in the direction from the bottom pole to the top pole (e.g., times "i" through "m" in FIG. 1C), the positively charged ions of the beam 24 are subjected to a positive lateral force on the X axis. As noted above, the scanner 36 need not be magnetic. For high-energy, low-current beams, electrostatic scanners can be more advantageous.

FIG. 1B illustrates the scanned beam 24 having an induced angular deflection as it passes through the scanner 36 at several exemplary discrete points in time during scanning prior to entering the parallelizer 38. FIG. 1D illustrates the beam 24 impacting the workpiece 30 at the corresponding times indicated in FIG. 1C. The scanned and parallelized ion beam 24a in FIG. 1D corresponds to the applied coil currents at the time "a" in FIG. 1C, and similarly, the beam 24c-24m is illustrated in FIG. 1D for scan currents at corresponding times "c", "e", "g", "i", "k", and "m" of FIG. 1C for a single substantially horizontal scan across the workpiece 30 on the X axis.

FIG. 1E illustrates a simplified scanning path of the beam 24 across the workpiece 30, wherein mechanical actuation (not shown) translates the workpiece 30 along a Y axis during X axis scanning by the scanner 36, whereby the beam 24 is imparted on the entire exposed surface of the workpiece 30.

Prior to scanning in the scanner 36, the ion beam 24 typically has a width and height profile of non-zero X and Y dimensions, respectively. One or both of the X and Y dimensions of the beam may vary during transport. For example, as the beam 24 is transported along the beam path toward the workpiece 30, the beam 24 encounters various electric and/or magnetic fields and devices that may alter the beam profile. In addition, space-charge effects, including mutual repulsion of positively charged beam ions, tend to diverge the beam (e.g., increased X and Y dimensions), absent countermeasures.

The geometry and operating fields of the scanner 36 provide certain focusing properties with respect to the ion beam 24. In general, the scanner has a variable focal length depending on the angle through which the beam is deflected. A larger angle leads to a shorter focal length. Thus, beams near the edge of the workpiece tend to be smaller and more focused (e.g. 24a and 24m in FIG. 1D) than beams near the center of the scanning field that have a small or zero angle of scanning deflection (e.g., 24e, 24g, and 24i in FIG. 1D). In addition, both the beam size and beam current may change when the scanner field is near zero, creating a condition referred to as the zero-field effect (ZFE). This effect is caused (in whole or in part) by electrons that pass into the scanner, or remain in the beam in the scanner, that would have otherwise been excluded from the ion beam by the electric or magnetic field of the scanner. This effect can increase the beam current and reduce the beam size. In addition, it is possible for electrons to be expelled from the beam at scanner fields very near zero, causing an abrupt, but not necessarily large, change in the current and beam size during the zero-field period as compared with the very low-strength fields that may precede and/or follow. Similar effects may also occur with other scanning systems, such as electric scanners, but the effect is frequently evident in magnetic scanning systems.

FIGS. 1F-1L illustrate the incident beam 24 corresponding respectively to the scanned instances 24a, 24c, 24e, 24g, 24k, and 24m, respectively. As the beam 24 is scanned across the workpiece 30 in the X direction, the X direction focusing of the scanner 36 varies, leading to decreased lateral focusing 24c of the beam 24 as it moves toward the center, resulting in a progressive increase in beam size 24e. As the angle of deflection induced by the scanner 36 approaches zero, the strength of the field generated by the scanner 36 also approaches zero and the zero-field effect manifests as an increase in current and a lateral decrease in the profile of the ion beam 24g. As the scanner 36 passes through and past zero, the zero-field effect diminishes, the beam size returns to a comparably wide, lower current ion beam 24i, which is progressively focused to the smaller size 24k, 24m as the ion beam 24 reaches the opposing maximum of the scanner 36. The sequence of FIGS. 1F-1L does not illustrate the very rapid increase in beam size and decrease in current at field values very near zero, as described above.

In the manufacture of integrated circuit devices and other products, it is desirable to implant the dopant species uniformly across the workpiece 30, or non-uniformly according to a prescribed distribution, and to have the beam properties (e.g. size, shape, angles) be uniform across the workpiece 30. The property variations caused by the zero-field effect can lead to undesirable inconsistent implantation along the scanning axis (e.g., in the X direction.) Such an inconsistency can be addressed, in one example, by adjusting the scan waveform. In places where there is incorrect flux, the scanner is programmed to adjust the rate of traversal of the beam across the workpiece, such that the ion beam moves more quickly over portions of the workpiece that would otherwise receive too much flux, and more slowly over portions of the workpiece that would otherwise receive too little flux. However, as noted hereinabove, the effects of the zero-field effect may be abrupt as the strength of the field of the scanner nears zero, and the scanning system may be unable to perform the traversal rate adjustments that would be necessary to mitigate the zero-field effect.

An alternative technique for compensating for the zero-field effect involves adjusting of the focal properties of the ion beam, such as (e.g.) by generating an electric field proximate to the ion beam, in relation to the zero-field effects of the scanner upon the ion beam. An ion implantation system in accordance with this technique might comprise an ion source configured to produce an ion beam; a mass analyzer configured to selectively filter the ions of the ion beam based on charge-to-mass ratio; a scanner configured to scan the ion beam and to direct the ion beam toward the workpiece; and a focus adjustment component configured to adjust a focal property of the ion beam in relation to zero-field effects of the scanner upon the ion beam. This technique may be used compensate for the zero-field effects induced by the scanner in order to promote the consistency of the implanted ion density across the workpiece. Alternately, this technique may be used to compensate for the zero-field effects induced by the scanner in order to promote the consistency of the ion beam profile as the ion beam is scanned across the workpiece.

Figure 2B:
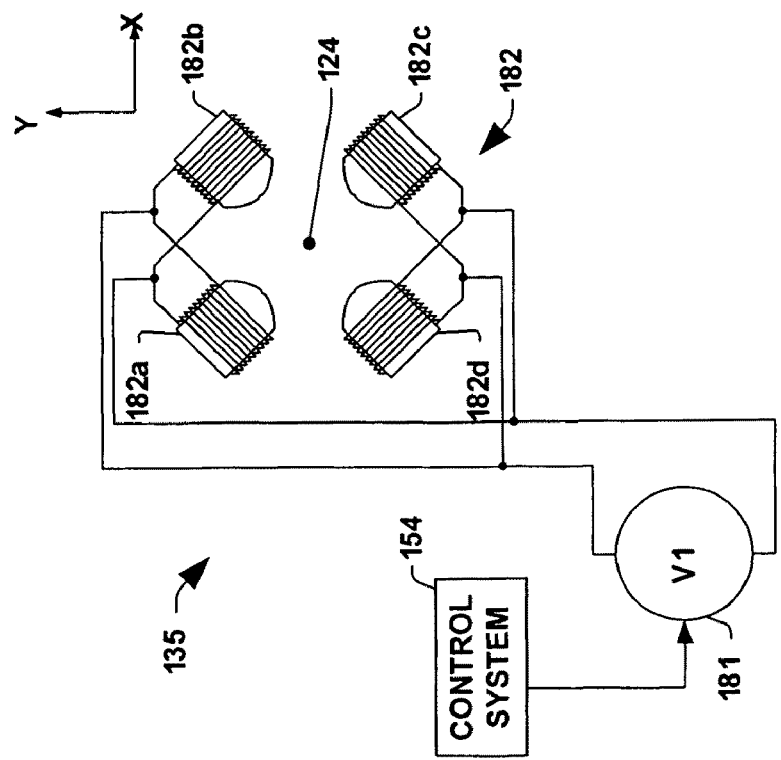
FIG. 2B is a simplified side elevation view illustrating still another focus adjustment component in accordance with the present disclosure, comprising a magnetic quadrupole with four electromagnets positioned around the ion beam path.
Figure 2A:
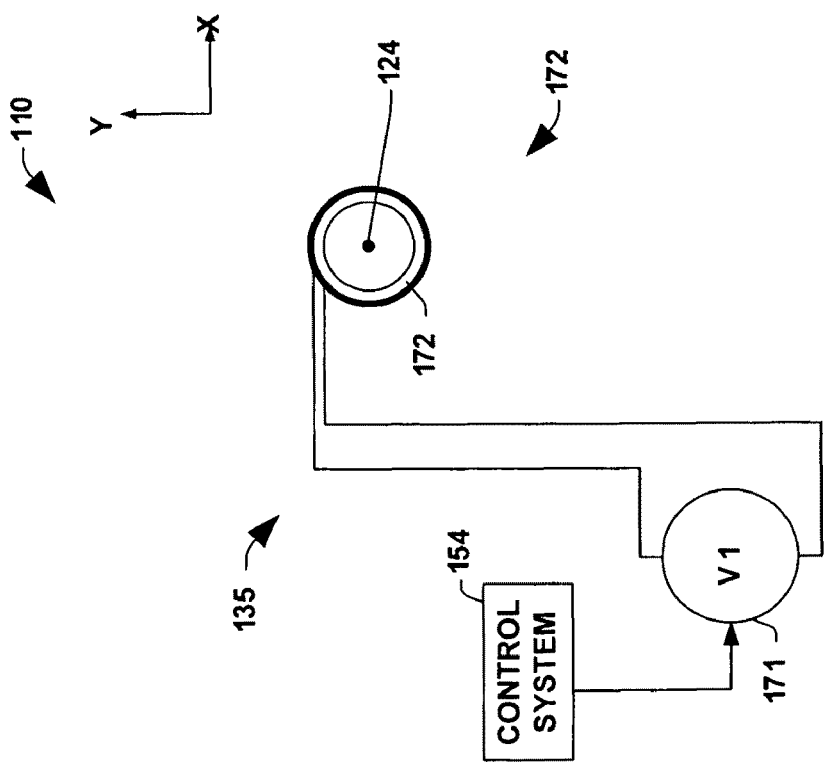
FIG. 2A is a simplified side elevation view illustrating a focus adjustment component in accordance with the present disclosure, comprising a solenoid.

Referring to FIGS. 2A and 2B, the focus adjustment component 135 generates one or more time varying magnetic fields proximate to the mass analyzed ion beam 126 in order to adjust a focal property of the focus adjusted ion beam 124, thereby compensating for one or more time varying focal properties due to the scanner 136, such as the ZFE or the angle-dependent focal length of the scanner. FIG. 2A illustrates one implementation of such a focus adjustment component 135, comprising a solenoid 172 with windings encircling the beam path that operates to generate a time varying magnetic field, wherein a power source 171 is coupled with the solenoid to provide time varying current to the solenoid. The power source 171 provides time varying current to the solenoid 172, wherein the source 171 may apply a pulsed waveform with pulses at twice the frequency of the scanner and phased such that the pulses correspond approximately to zero current in the scanner as illustrated in FIG. 2C. Other waveforms may be superimposed on the illustrated pulse train to cancel other effects from the scanner or other beamline components. For example, a triangular waveform at twice the scan frequency can be used to cancel the effects of the angle-dependent focusing of the scanner. This, added to the waveform shown, would form a combined waveform with a triangle wave with pulses.

Another exemplary implementation is illustrated in FIG. 2B, in which the focus adjustment component 135 comprises a quadrupole magnet 182 having four electromagnets 182a-182d positioned around the beam path, as well as a power source 181 providing time varying currents to the electromagnets 182a-182d. As with the solenoid above, the electromagnet currents provided by the power sources 171 and 181 in FIGS. 2A and 2B are adjusted to produce one or more time varying magnetic fields having a strength that is related to the position of the scanned ion beam 124 along the scan direction axis, such as a series of pulses at twice the scan frequency and phased to cancel the effects of the ZFE.

When the polarity of the currents through the electromagnets 182a-182d are such that magnetic north poles are facing the beam 124 from the magnets 182a and 182c and magnetic south poles face the beam 124 from magnets 182b and 182d, the quadrupole 182 will cause divergence of the beam 124 in the Y direction and convergence in the X direction. When the currents from the power source 181 produce magnetic north poles at the magnets 182b and 182d and magnetic south poles at the magnets 182a and 182c, the beam 124 converges in the Y direction and diverges in the X direction. Using a pair of quadrupoles with opposite polarities (a doublet), or three quadrupoles with alternating polarities (a triplet), convergence or divergence in both the X and Y directions is possible. In the illustrated example, the power source 181 provides time varying voltages to the coils of the electromagnets 182a-182d generally as illustrated in FIG. 2C (V1 alternating waveform in FIG. 2C) to establish time varying coil currents at twice the scan frequency, whereby the strength of the time varying magnetic fields is related to the position of the scanned ion beam 124 along the scan direction axis. The quadrupoles can also be electric quadrupoles and the operation is analogous; replace poles with electrodes and currents with voltages.

Moreover, the focus adjustment may be advantageously varied in relation to many properties of the ion implantation system. In the illustrated example, the focus adjustment is related to the scanning current V1, such that a relationship exists between the strength of the focus adjustment and the strength of the field of the scanner. This relationship may be linear at twice the frequency, pulsed (as illustrated in FIG. 2C), logarithmic, stepped, etc. As another example, the strength of the focus adjustment may be related to the angle of ion beam deflection induced by the scanner, and/or the angle of incidence of the ion beam with the workpiece.

The electromagnet currents provided by the power sources 171 and 181 in FIGS. 2A and 2B can be adjusted to produce one or more time varying magnetic fields having a strength that is related to the field of the scanner, such as a series of pulses at twice the scan frequency, for example, and such that each pulse corresponds to a zero-crossing of the scanner field, as shown in FIG. 2C.

The resulting focus adjusted beam 124 is then provided to the scanner 136 downstream of the focus adjustment component 135 along the beam path. The scanner 136 then scans the focus adjusted ion beam along a scan direction axis (e.g., the X direction in the illustrated system 110) that is substantially perpendicular to the beam path, wherein the scanner 136 scans the beam 124 at a scan frequency, as illustrated in FIG. 2C. In the illustrated implementation, the scanner 136 comprises a pair of pole pieces 136a and coils 136b above and below the beam path, as well as a current source 152 that provides alternating currents to the coils 136b, as illustrated in the waveform diagram 160 of FIG. 2C.

The time varying current though the coils 136b generates a time varying magnetic field across the beam path between the poles 136a, by which the beam 124 is bent or deflected (e.g., scanned) across the scan direction to provide a ribbon-shaped scanned ion beam 124 to the parallelizer 138 (FIG. 1A). When the scanning field is in the direction from the top pole to the bottom pole (such as at times "a" and "c" in FIG. 2D), the positively charged ions of the beam 124 are subjected to a lateral force in the negative X direction, wherein the converse is true when the scanning field is in the opposite direction. The scanner can also use electric fields, rather than magnetic fields and the operation of the disclosure remains essentially the same.

As illustrated in FIG. 2C, the exemplary focus adjustment waveform V1 is a time-varying current provided to the focus adjustment electromagnets 182a-182d, wherein the magnitude or amplitude of the adjustment current V1 determines the amount of focusing (e.g., the amount of convergence as the beam 124 exits the focus adjustment component 135). The adjustment apparatus 135 effectively provides an adjusted or corrected focal distance that is determined by the current V1, the length and geometry of the adjustment electromagnets 182a-182d. No correction for the zero-field effect is required when the scanner field is high, so the focus adjustment current is zero. As the scanner field approaches, and then passes through zero, the focus adjustment current is increased rapidly to a maximum and then decreased back to zero.

Figure 2D:
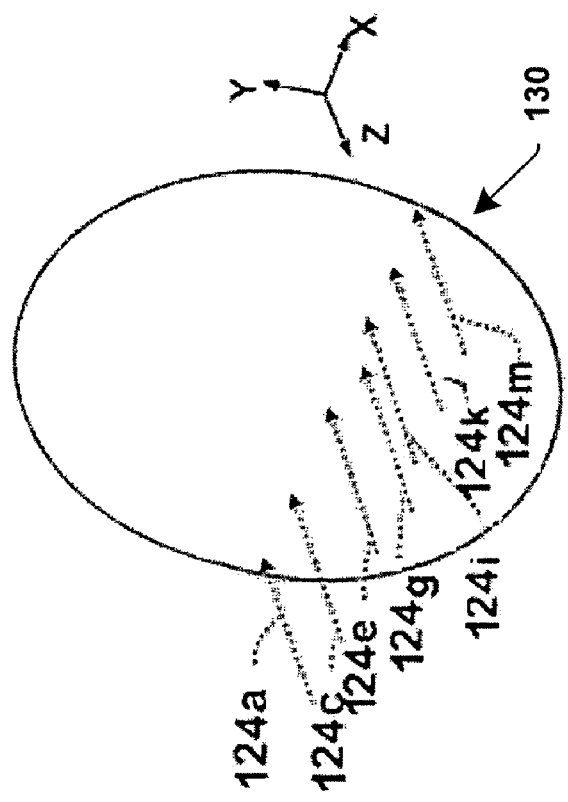
FIG. 2D is a perspective view illustrating a scanned ion beam striking a workpiece in the ion implantation system at several discrete points in time.
Figure 2C:
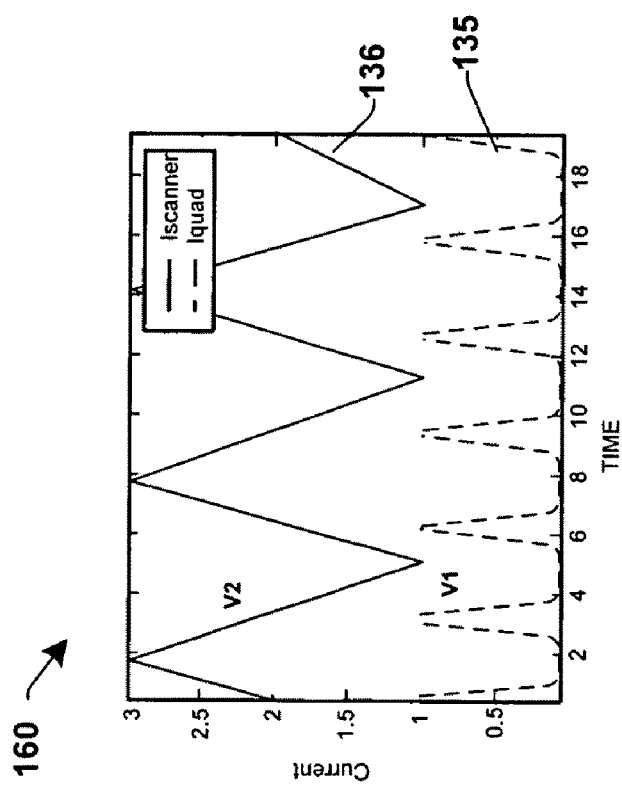
FIG. 2C is a graph illustrating scanning coil current waveforms and focus adjustment component current waveforms in the scanner of FIGS. 1A and 1B.

Referring also to FIG. 2D, the focus adjusted beam 124 is thus scanned and parallelized in the scanner 136 and the parallelizer 138, respectively, and presented to the end station 116 to implant the workpiece 130 as it is translated in the positive Y direction. FIG. 2D illustrates the scanned and parallelized ion beam 124 impinging the workpiece 130 at several discrete times "a", "c", "e", "g", "i", "k", and "m" for a half cycle of the exemplary triangular scanning current waveform of the supply V2 136, with the corresponding times being indicated in the waveform diagram 160 of FIG. 2C. Modifications to the beam size are made to compensate for the effects of the zero-field anomaly. Comparing FIGS. 1F-L with FIGS. 2E-K, it can be seen that the beam is made broader to spread the effect of the current peaking near zero magnetic field.

FIGS. 2E-2K illustrate the beam sizes as the ion beam traverses the workpiece, and the FIGS. 2E, 2F, 2G, 2H, 2I, 2J, and 2K correspond respectively to the scanned instances 124a, 124c, 124e, 124g, 124i, 124k, and 124m of FIG. 2D. It will be appreciated, especially in comparison with FIGS. 1F-1L, that the beam width W is more consistent as the ion beam is scanned across the workpiece 30 in the X direction. The zero-field effects that are apparent in FIGS. 1F-1L as an abrupt decrease of the ion beam size as the field of the scanner 36 approaches zero are reduced as the focal adjustment of the ion beam 24 mitigates the zero-field effects of the scanner 36 upon the ion beam 24.

FIGS. 2L-2M illustrate other possible implementations of the focus adjustment component in the exemplary ion implantation system 110. In FIG. 2L, a pair of conductive focus adjustment electrodes or plates 135a and 135b positioned on either lateral side of the beam path, which extend substantially parallel to the beam path. The focus adjustment component 135 also includes a power source 151 coupled with the electrodes 135a and 135b, which provides a time varying (e.g., common mode) potential to the focus adjustment electrodes, thereby generating electric fields between the plates 135a and 135b and the grounded enclosure or housing thereof, and as illustrated in a waveform diagram 160 in FIG. 2C. The power source V1 151 may be programmable or may be controlled by a control system 154 to provide the voltage waveforms illustrated and described hereinafter. At the entrance and exit ends of the focus adjustment electrodes 135a and 135b, electric field lines extend between the grounded focus adjustment component housing and the electrodes 135a and 135b, which fields operate to initially diverge the beam 124 as it enters the portion of the beam path between the electrodes 135a and 135b, and then converge the beam 124 as it leaves the electrodes 135a and 135b.

In FIG. 2M, the focus adjustment component 135 comprises a conductive Einzel lens (e.g., single lens electrode) 135d that extends around the ion beam path, as well as a power source V1 151 that provides a time varying potential to the Einzel lens 135d. As with the dual adjustment electrode example of FIGS. 2L above, the Einzel lens 135d is energized with a time varying voltage V1 as illustrated in FIG. 2C, and generates time varying electric fields at the entrance and exit thereof to adjust a focal property of the focus adjusted ion beam 124.

Figure 3:
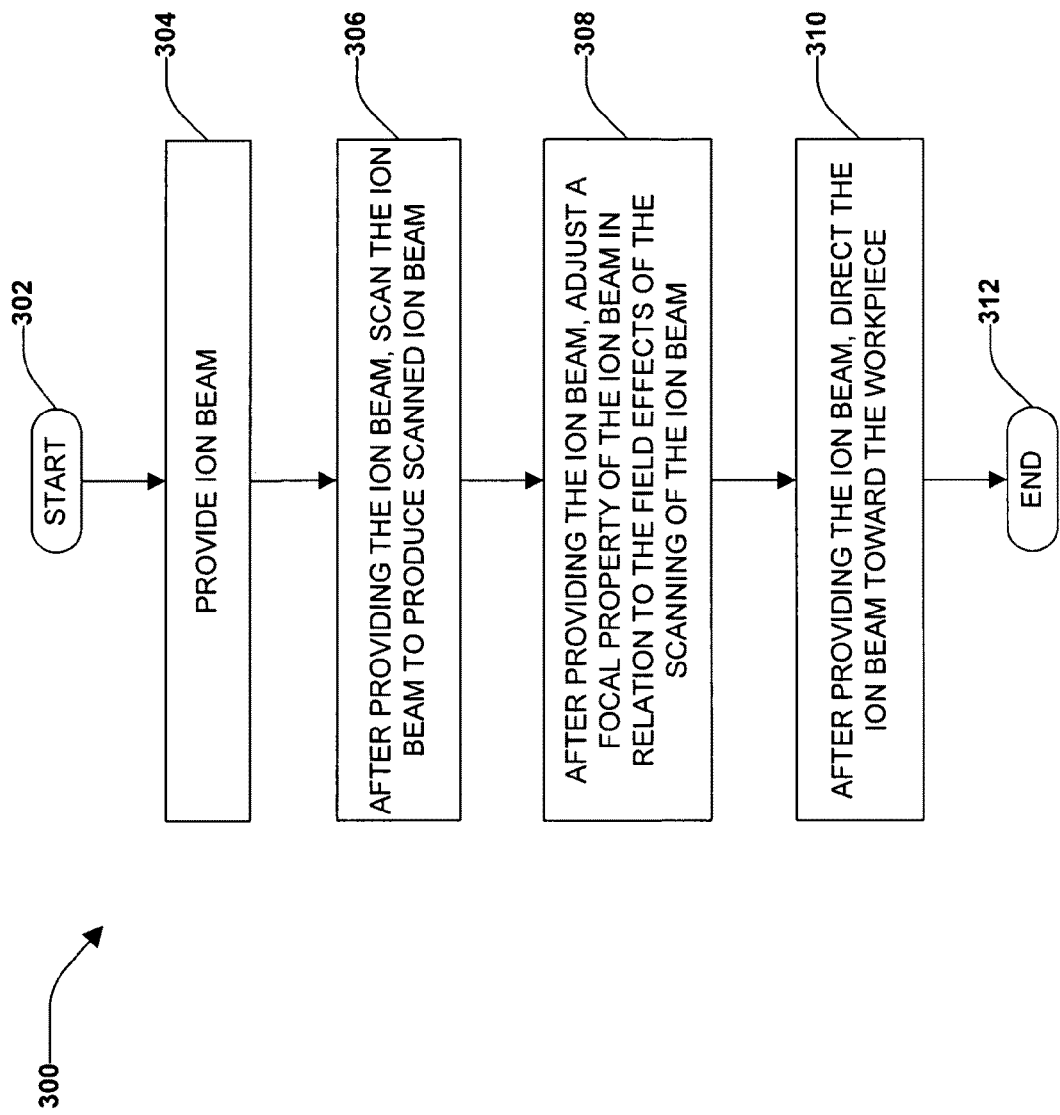
FIG. 3 is a flowchart illustrating a method in accordance with the present disclosure.

Another aspect of the present disclosure involves methods for providing a scanned ion beam to a workpiece, which may be practiced in the systems illustrated and described herein, as well as in other systems. An exemplary method in accordance with the present disclosure is illustrated in FIG. 3. In this figure, the method 300 begins at 302 and involves providing an ion beam 304. After the ion beam is provided 304, the method 300 involves scanning the provided ion beam to produce the scanned ion beam 306. The method 300 also involves adjusting a focal property of the ion beam in relation to the zero-field effects of the scanning of the ion beam 308. The method 300 also involves directing the ion beam toward the workpiece 310, and the method 300 ends at 312 upon completion of these effects. By accomplishing these effects, the ion beam provided to the workpiece is both scanned across the workpiece, and focus-adjusted to account for the zero-field effects induced by the field of the scanner.

It will be appreciated that the elements of this method may be carried out in varying order to produce alternatively ordered methods that are still in accordance with the present disclosure. For example, in some embodiments, the scanning of the ion beam 306 may occur before adjusting the focal property of the ion beam 308, while in other embodiments, the scanning of the ion beam 306 may occur after adjusting the focal property of the ion beam 308 (e.g., the system may be calibrated to detect the amount of focus adjustment required for varying zero-field effects of the scanner, such that a focus adjustment component is positioned upstream of the scanner in the beamline assembly.) As another exemplary variation, the elements of this method need not be embodied as discrete units; for instance, a scanner may be incorporated that both scans the ion beam and directs it toward the workpiece, and may simultaneously achieve these ends. It will also be appreciated that this method may be varied according to the principles described herein to produce embodiments of this method having the various advantages described herein, and that such methods may be in accordance with the present disclosure.

Although the disclosure has been illustrated and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (assemblies, elements, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, "exemplary" as utilized herein merely means an example, rather than the best.

What is claimed is:

1. An ion implantation system for implanting ions in a workpiece, comprising:
    an ion beam source configured to generate an ion beam;
    a mass analyzer for mass analyzing the ion beam generated;
    a scanner configured to scan the ion beam across the workpiece;
    a focus adjustment component comprising an adjustment field configured to adjust at least one focal property of the ion beam with respect to a zero-field effect of the scanner upon the ion beam; and
    a power source configured to provide a pulsed waveform to the focus adjustment component at twice a frequency of the scanner scanning of the ion beam, wherein a timing of the pulsed waveform substantially coincides with a position of the scanned ion beam that experiences the zero-field effect.

2. The ion implantation system of claim 1, wherein the focal property comprises beam size, beam current, or both beam size and beam current.

3. The system of claim 1, wherein the focus adjustment component adjusts the focal property to provide consistency of the focal property of the ion beam as the beam is scanned across the workpiece.

4. The system of claim 1, wherein the focus adjustment component adjusts the focal property to provide consistency of the ion dose as the beam is scanned across the workpiece.

5. The ion implantation system of claim 1, wherein the scanner comprises a scan field proximate to the ion beam, and wherein the focus adjustment component is configured to adjust the focal property of the ion beam in relation to the strength of the field.

6. The ion implantation system of claim 5, wherein the adjustment field comprises an adjustment field strength such that when the scan field is below a threshold and approaching about zero, the adjustment field comprises an inverse relation to the scan field and is thereby increased.

7. The ion implantation system of claim 1, wherein the focus adjustment component is configured to adjust the focal property of the ion beam in relation to the position of the ion beam along the scan direction axis.

8. The ion implantation system of claim 1, wherein the focus adjustment component is configured to adjust the focal property of the ion beam in relation to the angle of incidence of the ion beam with the workpiece.

9. The ion implantation system of claim 1, further comprising a beam profiling component configured to measure a profile property of the ion beam, wherein the focus adjustment component is configured to adjust the focal property of the ion beam according to the profile property.

10. The ion implantation system of claim 1, wherein the focus adjustment component comprises:
    one or more electric quadrupoles with focus adjustment electrodes spaced from one another around a path of the ion beam; and
    a power source coupled with the focus adjustment electrodes that provides a time varying potential to at least two of the focus adjustment electrodes.

11. The ion implantation system of claim 1, wherein the focus adjustment component comprises:
    one or more magnetic quadrupoles with focus adjustment poles spaced from one another around a path of the ion beam; and
    a power source coupled with the focus adjustment coils that provides a time varying current to at least one of the focus adjustment coils.

12. A scanning system for providing an ion beam to a workpiece in an ion implantations system, the scanning system comprising:
    a scanner configured to receive an ion beam and to produce a scanned ion beam directed toward the workpiece;
    a beam profiling component configured to measure a profile property of the ion beam;
    a focus adjustment component configured to adjust a focal property of the ion beam in relation to the profile property measured by the beam profiling component;
    wherein the focus adjustment component comprises an adjustment field associated therewith for counteracting zero field effects, and is configured to vary the adjustment field to adjust the focal property; and
    a power source configured to provide a pulsed waveform to the focus adjustment component at twice a frequency of the scanner scanning of the ion beam, wherein a timing of the pulsed waveform substantially coincides with a position of the scanned ion beam that experiences the zero-field effect.

13. The scanning system of claim 12, wherein the focus adjustment component is configured to adjust the focal property of the ion beam to promote the consistency of the ion beam profile scanned across the workpiece.

14. The scanning system of claim 12, wherein the focus adjustment component is configured to adjust the focal property of the ion beam to promote the consistency of the implanted ion density across the workpiece.

15. The scanning system of claim 12, wherein the scanner is configured to scan the ion beam along a scan direction axis substantially perpendicular to the beam path, and wherein the focus adjustment component is configured to adjust the focal property of the ion beam in relation to the position of the ion beam along the scan direction axis.

16. The ion implantation system of claim 12, wherein the focal property comprises beam size, beam current, or both beam size and beam current.

17. The ion implantation system of claim 12, wherein the focus adjustment component comprises:
one or more electric quadrupoles with focus adjustment electrodes spaced from one another around a path of the ion beam; and
a power source coupled with the focus adjustment electrodes that provides a time varying potential to at least two of the focus adjustment electrodes.

18. A method of providing an ion beam in an ion implantation system, the method comprising:
generating an ion beam;
scanning the ion beam generated with a scan field to produce a scanned ion beam;
measuring a focal property of the ion beam;
determining zero field effects from the focal property measured; and
adjusting the focal property of the ion beam with respect to the zero-field effects by varying an adjustment field strength generated by an adjustment field component,
wherein the adjusting of the focal property is performed by a pulsed waveform to a focus adjustment component at twice a frequency of the scanning of the ion beam, wherein a timing of the pulsed waveform substantially coincides with a position of the scanned ion beam that experiences the zero-field effect.

19. The method of claim 18, wherein the ion beam is scanned along a scan direction axis, wherein the focal property of the ion beam is adjusted in relation to the position of the ion beam along the scan direction axis, and wherein the focal property comprises beam size, beam current, or both beam size and beam current.

20. The method of claim 18, wherein the ion beam is scanned along a scan direction axis, the adjustment field strength is varied as a position of the ion beam along a scan direction axis is varied, and when the scan field is below a threshold and approaching about zero, the adjustment field comprises an inverse relation to the field of the scanner and is thereby increased.

* * * * *